United States Patent
Shau

(10) Patent No.: US 7,782,655 B2
(45) Date of Patent: Aug. 24, 2010

(54) ULTRA-LOW POWER HYBRID SUB-THRESHOLD CIRCUITS

(76) Inventor: Jeng-Jye Shau, 991 Amarillo Ave., Palo Alto, CA (US) 94303

(*) Notice: Subject to any disclaimer, the term of this patent is extended or adjusted under 35 U.S.C. 154(b) by 78 days.

(21) Appl. No.: 12/165,658

(22) Filed: Jul. 1, 2008

(65) Prior Publication Data
US 2010/0002532 A1 Jan. 7, 2010

(51) Int. Cl.
*G11C 11/00* (2006.01)
(52) U.S. Cl. ........................ 365/154; 365/229; 365/226; 365/227
(58) Field of Classification Search ........................ None
See application file for complete search history.

(56) References Cited

U.S. PATENT DOCUMENTS

| | | | |
|---|---|---|---|
| 6,091,656 A * | 7/2000 | Ooishi | 365/226 |
| 6,404,670 B2 | 6/2002 | Shau | |
| 6,449,182 B1 * | 9/2002 | Ooishi | 365/63 |
| 6,563,758 B2 | 5/2003 | Shau | |
| 6,606,275 B2 | 8/2003 | Shau | |
| 6,608,780 B2 | 8/2003 | Shau | |
| 6,744,659 B1 * | 6/2004 | Eby et al. | 365/154 |
| 7,064,376 B2 | 6/2006 | Shau | |
| 7,092,309 B2 * | 8/2006 | Liaw | 365/229 |
| 7,113,421 B2 * | 9/2006 | Maeda et al. | 365/154 |
| 7,136,296 B2 * | 11/2006 | Luk et al. | 365/154 |
| 7,154,770 B2 * | 12/2006 | Islam | 365/154 |
| 7,245,548 B2 * | 7/2007 | Derner et al. | 365/229 |
| 7,292,069 B2 | 11/2007 | Hannah et al. | |
| 7,307,899 B2 * | 12/2007 | Khellah et al. | 365/189.11 |
| 7,372,721 B2 * | 5/2008 | Sachdev et al. | 365/154 |
| 7,397,721 B2 * | 7/2008 | Lee | 365/227 |
| 7,420,834 B2 * | 9/2008 | Maeda et al. | 365/154 |
| 2007/0242498 A1 * | 10/2007 | Chandrakasan et al. | 365/154 |

OTHER PUBLICATIONS

Wang, Calhoun and Chandrakasan, "Sub-Threshold Design for Ultra-Low Power Systems," Spring 2006.
B Zhai, S. Hanson, D. Blaauw, and D. Sylvester, "Analysis and Mitigation of Variability in Subthreshold Design", ACM/IEEE International Symposium on Low Power Electronics and Design, Aug. 2005.
A. Raychowdhury, B. Paul, S. Bhunia, and K. Roy, "Computing with Subthreshold Leakage: Device/Circuit/Architecture Co-Design for Ultralow-Power Subthreshold Operation", IEEE Transactions on VLSI Systems, Nov. 2005, pp. 1213-1224 (No. 105).
A. Raychowdhury, S. Mukhopadhyay, and K. Roy, "A Feasibility Study of Subthreshold SRAM Across Technology Generations", Proceedings of the 2005 International Conference on Computer Design.
T.H. Kim, J. Liu, J. Keane, and C.H. Kim, "A 0.2 V, 480 Kb Subthreshold SRAM with 1 k Cells Per Bitline for Ultra-Low-Voltage Computing", IEEE J. of Solid-State Circuits, vol. 43, No. 2, Feb. 2008, pp. 518-529.

(Continued)

*Primary Examiner*—Viet Q Nguyen

(57) ABSTRACT

The present invention provides a solution to avoid the robustness problems of sub-threshold circuits by switching small parts of circuits to nominal-voltage only when they are being used, and switching them back to sub-threshold levels when the operation finishes. Such "hybrid sub-threshold" approach is capable of supporting ultra-low power operation without the disadvantages of sub-threshold circuits.

9 Claims, 3 Drawing Sheets

OTHER PUBLICATIONS

B. H. Calhoun, and A. P. Chandrakasan, "A 256-Kb 65-nm Sub-threshold SRAM Design for Ultra-Low-Voltage Operation", IEEE J. of Solid-State Circuits, vol. 42, No. 3, Mar. 2007, pp. 680-688.

T.H. Kim, J. Liu, J. Keane, and C.H. Kim, "A High-Density Sub-threshold SRAM with Data-independent Bitline Leakage and Virtual Ground Replica Scheme", ISSCC, vol. 11, Issue 15, Feb. 2007, pp. 330-606.

T. Kim, H. Eom, J. Keane, and C. Kim, "Utilizing Reverse Short Channel Effect for Optimal Subthreshold Circuit Design", ISLPED, Oct. 4, 2006.

A. Wang, A. Chandrakasan, "A 180mV FFT Processor Using Sub-threshold Circuit Techniques", ISSCC, 2004.

C. H. Kim, et al. "Ultra-low power DLMS adaptive filter for hearing add applications", IEEE TVLSI, Dec. 2003, pp. 1058-1067.

B. Calhoun, A. Chandrakasan, "Static Noise Margin Variation for Sub-threshold SRAM in 65-nm CMOS", IEEE Journal Solid-State Circuits, vol. 41, Issue 7, Jul. 2006, pp. 1673-1679.

J. F. Ryan, J. Wang, and B. H. Calhoun, "Analyzing and Modeling Process Balance for sub-threshold circuit design", Proceedings of the 17th ACM Great Lakes symposium on VLSI, 2007.

"A PLA based asynchronous micropipelining approach for sub-threshold circuit design", Proceedings of the 43rd annual conference on Design Automation, Session 27, 2006, pp. 419-424.

L. Nazhandali, B. Zhai, J. Olson, A. Reeves, M. Minuth, R. Helfand, S. Pant, T. Austin, and D. Blaauw, Energy Optimization of Subthreshold-Voltage Sensor Network Processors, 32nd Annual International Symposium on Computer Architecture, 2005, pp. 197-207.

H. Soeleman, K. Roy, "Ultra-Low power digital subthreshold logic circuits", 1999 International Symposium on Low Power Electronics and Design, pp. 94-96.

"Double Gate-MOSFET subthreshold circuit for ultra low power applications", IEEE transactions on Electron Devices, vol. 51, Issue 9, Sep. 2004, pp. 1468-1474.

L. Nghandali, et al. "Energy optimization of subthreshold-voltage sensor network processors", ACM ISCA 2005.

B. Zhai, D. Blaauw, D. Sylvester, K. Flautner, "Theoretical and practical limits of dynamic voltage scaling", DAC 2004.

B. H. Calhoun, A. Chandrakasan, "Characterizing and modeling minimum energy operation for subthreshold circuits," ISLPED 2004.

* cited by examiner

Figure 1: Prior Art
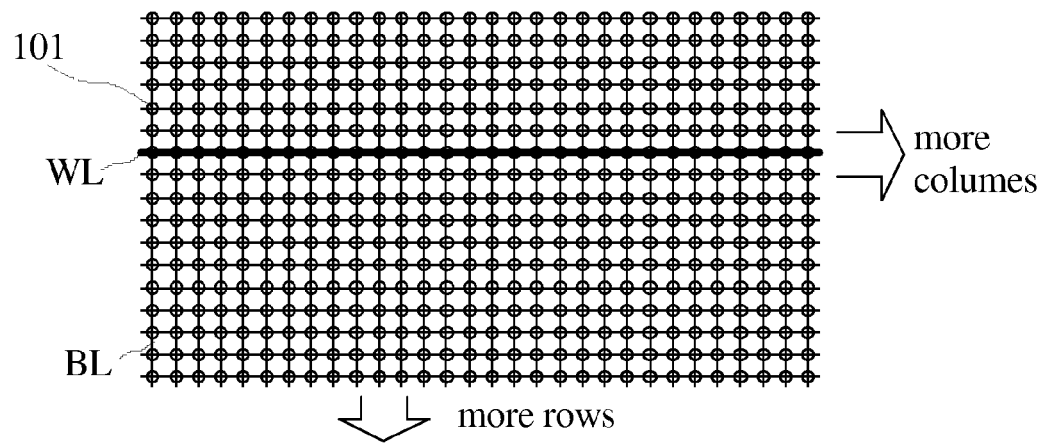
Figure 2(a): Prior Art
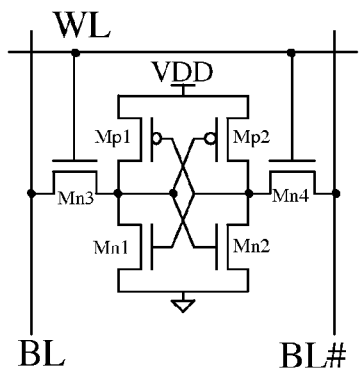
Figure 2(b): Prior Art
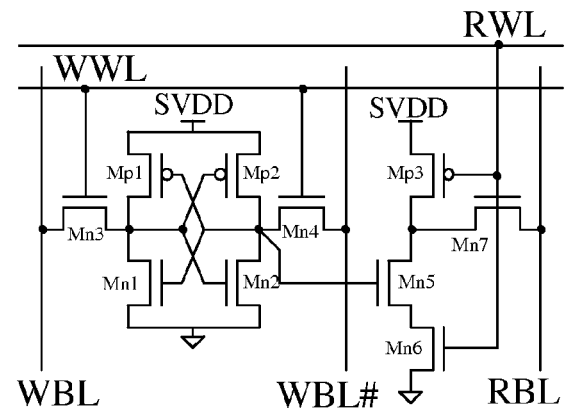

ULTRA-LOW POWER HYBRID SUB-THRESHOLD CIRCUITS

BACKGROUND OF THE INVENTION

The present invention relates to ultra-low power integrated circuits (IC), and more particularly to ultra-low power design for sub-threshold integrated circuits.

In recent years, the explosive growth of battery-powered portable applications, such as cellular phones and laptop computers, has generated tremendous demand for ultra-low power integrated circuits. Sub-threshold circuits, by definition, are integrated circuits designed to operate at power supply voltages lower than the threshold voltages of Complementary Metal Oxide Semiconductor (CMOS) transistors. At sub-threshold operation, transistor currents are reduced by many orders of magnitudes, promising ultra-low power operations. Although studies of sub-threshold circuits have reported promising results with respect to power saving, the technology has yet to be implemented on practical mass production products. A number of critical problems preventing their practical use have been identified:

Performance Problems: Low voltage operation typically can reduce power by one order of magnitude; however, it also slows down processing speed by one order of magnitude. Although architectural techniques such as pipelining and parallelism can help compensate for loss in performance, these techniques introduce significant overheads in power and cost. Slow processing speed is not the only performance problem; the worst problem is inconsistency in speed. Under sub-threshold operation, a gate delay can vary by 300% due to natural doping variations. These performance problems will disable most applications.

Stability Problems: Transistors in sub-threshold circuits operate at weak inversion conditions in which the source-drain current is an exponential function of temperature, voltage, and manufacturing parameters. Therefore, non-ideal effects (e.g., process variation, noise) are magnified exponentially, causing severe stability problems. Practical-scale integrated circuits can not operate with such stability problems.

Yield Problems: Due to the sensitivity of sub-threshold circuits, their effective defect density is significantly higher than that of nominal-voltage circuits. As a result, the yield of sub-threshold circuits is significantly lower than nominal voltage circuits, making it impractical to build large-scale integrated circuits.

Test Coverage Problems: Because sub-threshold circuits are sensitive to temperature, voltage, and noise, they are likely to have pattern-dependent or event-dependent failures. Testing methodologies developed for nominal-voltage circuits typically are not adequate for sub-threshold circuits.

Reliability Problems: Reliability failures are typically caused by marginal manufacturing defects that are not significant enough to prevent the IC from passing a production test but can cause failure under use. Test-coverage problems and circuit sensitivity are always followed by reliability problems. Reliability problems are the worst kind of problems due to potentially severe consequences.

In the following discussions, we will call the above problems in performance, stability, yield, test coverage, and reliability as the "sub-threshold problems" because they happen when integrated circuits are under sub-threshold operations. Robustness, consistence, testability, and reliability are absolutely essential requirements for IC technologies. The above problems of sub-threshold circuits outweigh their power saving advantage. These problems must be solved before practical applications of sub-threshold circuits can be built.

We believe power saving sub-threshold technology is extremely valuable because of its commercial and environmental benefits. However, sub-threshold circuits are not ready for practical-scale integrated circuits because of the aforementioned problems. It is therefore highly desirable to develop ultra-low power IC design technology that can avoid the "sub-threshold problems".

SUMMARY OF THE INVENTION

The primary objective of this invention is, therefore, to provide ultra-low power integrated circuits that can avoid the "sub-threshold problems". The other objective of this invention is to provide Static Random Access Memory (SRAM) devices that consume less power than current art sub-threshold SRAM while maintaining the robustness of nominal-voltage SRAM. Another objective is to design logic circuits that can support ultra-low power operations without suffering the "sub-threshold problems".

These and other objectives are achieved by switching small parts of circuits to nominal-voltage only when they are being used, and switching them back to sub-threshold levels when the operation finishes. We will call such an approach of the present invention the "hybrid sub-threshold" approach. The resulting circuits are capable of supporting ultra-low power operation without the disadvantages of sub-threshold circuits.

While the novel features of the invention are set forth with particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 1 is a simplified symbolic diagram of a prior art SRAM array;

FIG. 2(a) is a schematic diagram of prior art 6-transistor (6T) SRAM memory cell;

FIG. 2(b) is a schematic diagram of prior art 10-transistor (10T) SRAM memory cell;

DETAILED DESCRIPTION OF THE INVENTION

Figure 3:
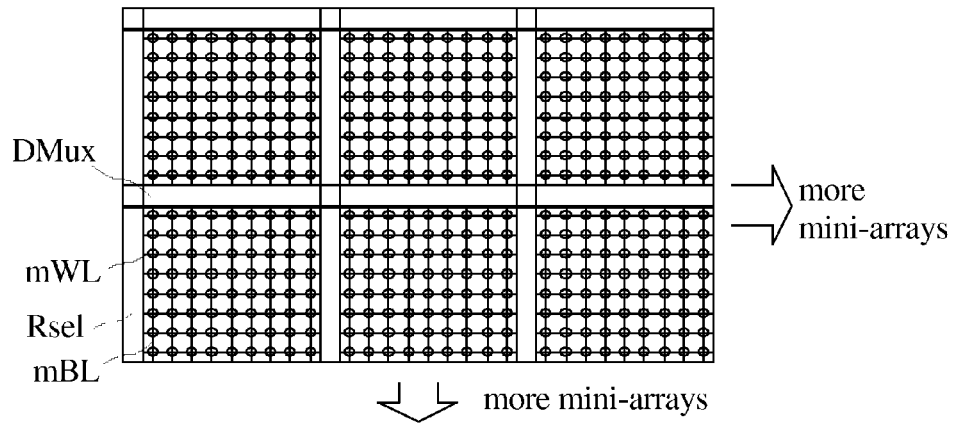
FIG. 3 is a simplified symbolic diagram of an SRAM array comprising mini-arrays.

To facilitate understandings of the present invention, we will start with a specific application in Static Random Access Memory (SRAM) design as an example to demonstrate the problems with existing approaches and the principles of the present invention.

Conventional SRAM is designed as a two dimensional array of memory cells as illustrated by the symbolic view in FIG. 1. In this figure, a memory cell (101) is represented symbolically by a circle, word lines (WL) are represented by horizontal lines, and bit lines (BL) are represented by vertical lines. For clarity, we are using simplified symbolic views in our discussion. In reality, each memory cell can have multiple word lines and multiple bit lines.

To read data from a conventional memory array, one word line (WL) is activated (illustrated by a bold line in FIG. 1) to turn on all the memory cells along one horizontal row. Each selected memory cell discharges one vertical bit line so the data stored in selected memory cells can be detected. During this process, all the memory cells in the memory array are disturbed.

FIG. 2(a) shows a schematic of a 6-transistor (6T) memory cell. This memory cell comprises two p-channel transistors (Mp1, Mp2) and 4 n-channel transistors (Mn1-Mn4). Transistors Mp1, Mn1, Mp2, and Mn2 are configured as back-to-back inverters to hold data by a positive feedback mechanism. The sources of n-channel transistors (Mn1, Mn2) are connected to ground. The sources of p-channel transistors (Mp1, Mp2) are connected to power supply (VDD). In this patent application, we define the node connected to the p-channel transistors of back to back inverters in an SRAM memory cell as "memory cell power supply". In prior art SRAM, the memory cell power supply (VDD) of the 6T cell is connected to that of all memory cells in the same memory array. The 6T cell is selected by a word line (WL) through transistors Mn3 and Mn4 so that data can be read/written by a pair of bit lines (BL, BL#). This 6T cell has been widely used in the IC industry. For IC technologies older than 150 nm technologies, the SRAM cell consumes little power. Starting from 150 nm technologies, the SRAM memory cells produced by advanced IC technologies started to consume significant power due to sub-threshold leakage current as well as gate leakage current. Such leakage current increases exponentially with power supply voltage so for advanced IC technologies, it is desirable to reduce the power supply voltage to save power. We will call IC technologies supporting transistor channel lengths shorter than 150 nm as "advanced IC technologies".

As reported by many researchers, the 6T cell can not support both read and write operations reliably under sub-threshold operation for advanced IC technologies. To solve this problem, additional transistors were added to the memory cell to form 8T-10T cells. In particular, the 10T cell shown in FIG. 2(b) was studied. The 10T cell uses one word line (WWL) and a pair of bit lines (WBL, WBL#) to support write operations while using a separate word line (RWL) and bit line (RBL) to support read operations. The 10T cell functions in the same way as conventional 6T cells do for write operations, but use an additional 4 transistors (Mp3, Mn5-Mn7) to support read operations. The memory cell power supply (SVDD) of a 10T cell is biased at sub-threshold region. For 10T and other enhanced memory cells, more transistors were added to support sub-threshold operations. Such solutions introduce significant overheads, and suffer from the "sub-threshold problems" discussed previously.

In summary, sub-threshold SRAMs designed using conventional architecture suffer from the following problems:

(1) High operation power: the whole array is discharged to read one set of data;

(2) High cost: the memory cells are expensive; and (3) The "sub-threshold problems": low performance, instability, test difficulties, and poor reliability.

The "sub-threshold problems" only exist for sub-threshold circuits; they do not exist for nominal-voltage circuits. If we switch a small fraction of circuits to nominal-voltage only when they are being used, and switch them back to sub-threshold levels when the operation finishes, all the "sub-threshold problems" disappear, but the power saving advantages of pure sub-threshold circuits remain. We will call such an approach of the present invention the "hybrid sub-threshold" approach. While SRAM design is used to demonstrate an application of the hybrid sub-threshold approach, the same approach is applicable to logic circuits and other types of circuits.

Conventional SRAM designers try to make the memory array as large as possible to reduce cost. This approach breaks down when using sub-threshold technology. Researchers have already reported that 6T memory cells can not work in large sub-threshold memory arrays. The 10T memory cell solution adds additional overhead and still has the "sub-threshold problems". To solve these problems, we propose changing the paradigm that bigger is better for memory arrays. We should use small memory arrays instead. Normally, using small memory arrays to support large scale integrated circuits would create unacceptable overheads. The mini-array architecture solves this problem.

In mini-array architecture, a large array is divided into many small mini-arrays as illustrated by the symbolic diagram in FIG. 3. The memory cells in the mini-arrays are connected to horizontal mini word lines (mWL) and vertical mini bit lines (mBL) in the same ways as in conventional memory arrays, except the lengths of mWL and mBL are relatively short. Each mini-array is equipped with simplified peripheral circuits, so that operations in one mini-array will not influence operations in other mini-arrays. The mini-arrays communicate with external circuits through upper level word lines and upper level bit lines (not shown for simplicity). To read data from a mini array, one upper level word line is activated. This upper word line signal is qualified by row select switches (Rsel), so that only one of the mini word lines in one mini-array is activated. Only the mini-bit-lines in the same mini-array are discharged by the selected memory cells, while all the other circuits are not disturbed. A data multiplexer (DMux) is used to control data operations of a mini-array.

Figure 4A:
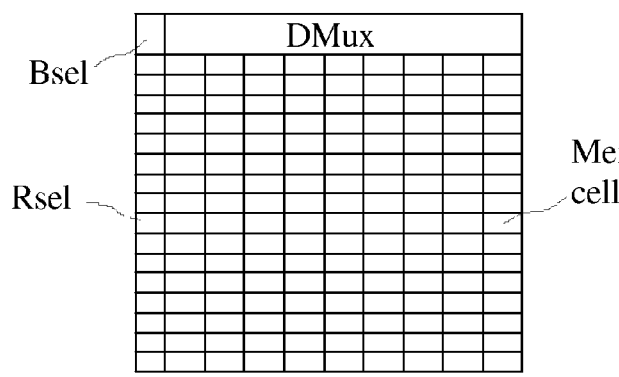
FIG. 4(a) is a simplified symbolic diagram of mini-arrays.
Figure 4B:
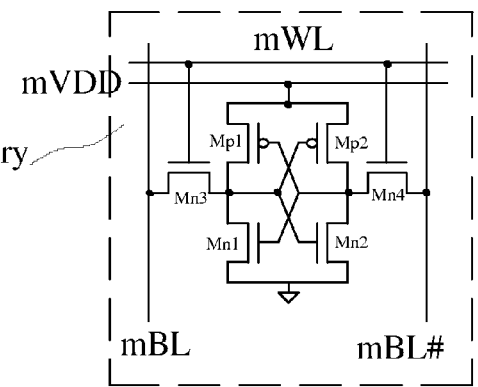
FIG. 4(b) is a schematic diagram of a 6T memory cell of the present invention.
Figure 5:
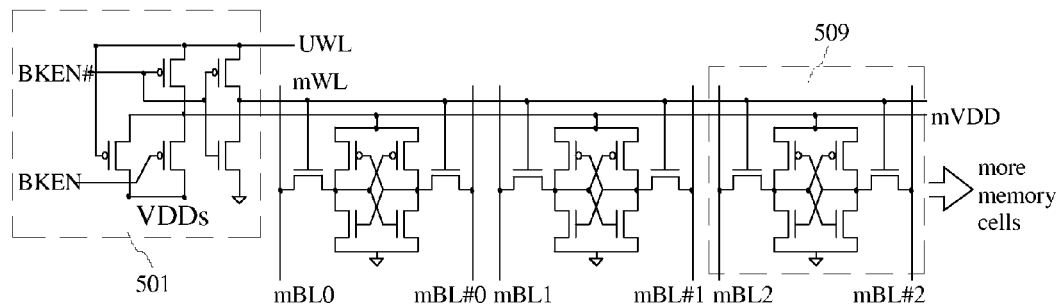
FIG. 5 is a schematic diagram of a mini row of the present invention.

To support independent operations, a mini-array is equipped with a block select circuit (Bsel), row select circuits (Rsel), and a data multiplexer (DMux), as illustrated in FIG. 4(a). These mini-array peripheral circuits add an array area overhead of approximately 20%. FIG. 4(b) shows one example of our SRAM memory cell. This cell is identical to the conventional 6T cell except its memory cell power supply (mVDD) is connected only to the memory cells in the same mini row. The word line of the memory cell is connected to the mini word line (mWL) and the bit lines of the memory cell are connected to mini bit lines (mBL, mBL#). As illustrated in FIG. 5, a row select circuit (501) controls the mWL and mVDD of one mini-row. A wire that connects the memory cell power supply of a subset of memory cells in an SRAM device is called a "memory cell power supply line" of the present invention. The memory cells (509) in the same mini row share the same memory cell power supply line (mVDD) but are connected to different mini bit lines (mBL0, mBL#0, mBL1, mBL#1, mBL2, mBL#2). The memory cell power supply line (mVDD) of a mini row is not shared between mini rows. When the memory cells are not used, mWL is at ground voltage and mVDD is at sub-threshold voltage (SVDD). When reading or writing the memory cells, block select signals (BKEN, BKEN#) qualify the upper word line (UWL) and control the voltage on the mini word line (mWL) and on the memory cell power supply line (mVDD). For selected memory cells, the mWL and mVDD are pulled up to nominal voltages, while for unselected memory cells, mWL is at ground voltage and mVDD is at sub-threshold voltage; that is, the selected 6T cell operates like a conventional nominal-voltage SRAM during read/write operations, and operates like a sub-threshold circuit at idle states. Table 1 lists the states of mWL and mVDD.

TABLE 1

| operations | mWL voltage | mVDD voltage |
|---|---|---|
| Memory cell not selected | Ground or near ground voltage | Sub-threshold voltage |
| Memory cell selected for read | Nominal-voltage | Nominal-voltage |
| Memory cell selected for write operations | Nominal-voltage | Nominal-voltage |

While specific embodiments of the invention have been illustrated and described herein, it is realized that other modifications and changes will occur to those skilled in the art. The hybrid sub-threshold approach of the present invention is more effective for SRAM arranged in mini-array architecture, but it is still applicable for SRAM arranged in other architectures. We used 6T memory cell in the above example, while other memory cells (such as 5T cell) are equally applicable. The 6T cell also can be used to support dual port operations. There are many ways to design the row select circuits; the design in FIG. 5 was just one of many possible designs. In the above example, the memory cells in one mini-row share the same memory cell power supply line (mVDD), but that is not the only possible arrangement. Sometimes it is desirable to connect two nearby rows to simplify mVDD connections. It is certainly applicable to connect all the memory cells in the same mini-array to further simplify mVDD connection. When a memory cell power supply line is connected to more memory cells, power consumption is higher because we may switch the memory cell power supply of unused memory cells, but the mVDD control circuit is simplified. It is certainly applicable to have more than one mVDD connection along one row of memory cells.

The magnitudes of sub-threshold voltage and nominal-voltage are dependent on IC manufacture technologies. A sub-threshold voltage is, by definition, lower in absolute value than the typical threshold voltage of CMOS transistors. For example, for standard 130 nm logic technologies, a sub-threshold voltage is equal or lower than 0.35 volts. A nominal-voltage is, by our definition, a voltage higher than twice the typical threshold voltage, in absolute value, of CMOS transistors. For example, for standard 130 nm logic technologies, a nominal-voltage is equal to or higher than 0.7 volts. Typically, a nominal-voltage is close to the standard power supply voltage of core logic circuits. For example, for standard 130 nm logic technologies, the standard power supply voltage is 1.2 volts and nominal-voltage for 130 nm technology is typically close to 1.2 volts. The voltages on memory cell power supply line (mVDD) are not necessarily the same during read and write operations. Sometimes it is beneficial to set mVDD at different voltages for SRAM read and write operations.

Although changing the memory cell power supply voltage may sound dangerous, it can be designed to be safe when the mini row is short. The mini bit lines are also desirable to be short; when the mini-bit lines are short, sense amplifiers are no longer necessary. Instead, simple inverters can read the data. Removing sense amplifiers can save a lot of power while improving robustness. A mini-array is much smaller than a conventional SRAM array. Typically, a mini word line is connected to 20 or less memory cells while a mini bit line is connected to 64 or less memory cells. In the following example, we will assume that the mini-array is 8 memory cells on a mini word line and 32 memory cells on a mini bit line.

Figure 6A:
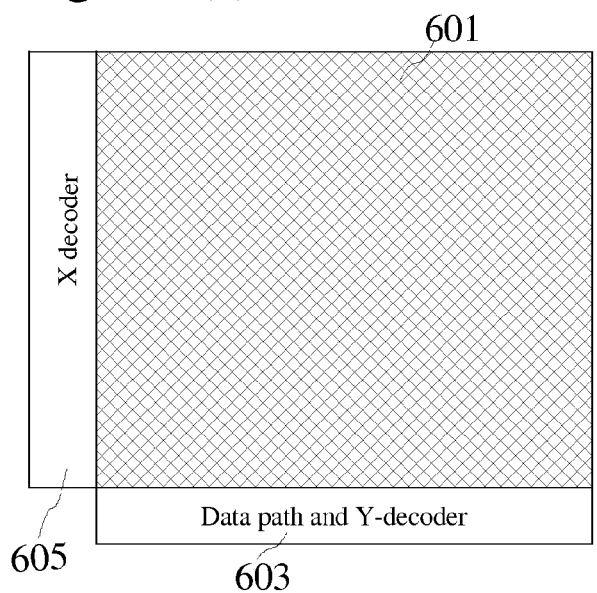
FIGS. 6(a, b) compare prior art SRAM structures with SRAM structures of the present invention.
Figure 6B:
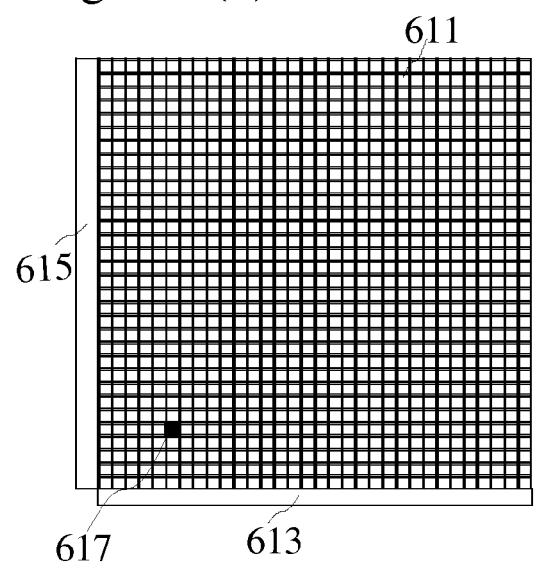

Conventional memory designers try to put as many memory cells as possible along both the word line and bit line directions in order to reduce cost. For example, a memory array with 256 cells on one word line and 1024 cells on one bit line has been reported. FIGS. 6(a) and 6(b) are simplified symbolic diagrams illustrating the relative sizes of circuit components between the conventional design in FIG. 6(a) and the mini-array design in FIG. 6(b), assuming both SRAM devices comprise the same number of memory cells (256× 1024 in this example). We will use the example of FIGS. 6(a) and 6(b) to compare the differences between conventional architecture and mini-array architecture.

Operation Power: In the conventional architecture, when 8 bits of data need to be read, the X decoder (605) determines which word line to look at. This turns on all 256 memory cells on that word line, discharging all 256 bit lines connected to those 256 memory cells. Since these bit lines are connected to memory cells on every other word line, this means 262144 memory cells are disturbed (if the array has 1024 word lines). In the mini-array architecture, when 8 bits of data need to be read, we only select 8 memory cells along a mini word line. This turns on only 8 memory cells and discharges 8 mini bit lines that are connected to 256 memory cells in a mini-array (617). All the other memory cells are not disturbed. At the upper level, an upper level word line is turned on. UWL is connected to 32 block select circuits with much lower loading. The data read from the mini-array goes through 8 upper level bit lines that are connected to 32 mini-array data paths. The upper level bit line loading is far less than that of conventional SRAMs.

In summary, the difference in the effective loading during a read operation is 1-2 orders of magnitudes. Because operational power is proportional to loading, the mini-array SRAM can reduce operational power by 1-2 orders of magnitude. Table 2 summarizes this comparison.

TABLE 2 comparison in active loading for memory read operation

| | Conventional architecture | Hybrid sub-threshold SRAM arranged in Mini-array architecture | Ratio in loading |
|---|---|---|---|
| Selected memory cells | 256 | 8 | 32:1 |
| Disturbed memory cells | 262144 | 256 | 1024:1 |
| Word line loadings | One word line with 512 gates | One mWL with 16 gates and One UWL with 32 gates and 32 diffusion contacts | ~10:1 |
| Bit line loadings | 256 bit lines with 262144 diffusion contacts | 8 mini bit lines with 256 diffusion contacts and 8 upper level bit lines with 256 diffusion contacts | ~30:1 |

Idle Power: While conventional sub-threshold SRAM supports read/write operations under sub-threshold voltage, mini-array SRAM needs only to hold data at sub-threshold operation. Consequently, we can operate at lower voltage than conventional sub-threshold SRAM, which means that much lower idle power is expected. In addition, the proposed design will use 50% fewer transistors than 10T SRAM. We can expect idle power one order of magnitude lower than pure sub-threshold SRAM, which is equivalent to two orders of magnitude lower than nominal-voltage SRAM.

Cost Comparison: Conventional SRAM requires big decoders (605) to drive the heavy loadings on a word line and large numbers of sense amplifiers and drivers (603) to support data paths that connect to a large number of bit lines. In mini-array architecture, we will incur ~20% overhead on mini-array peripheral circuits. However, the upper level decoders (615) and data paths (613) are much smaller due to simplified active loading as illustrated by the relative sizes shown in FIGS. 6(*a, b*). We can easily achieve much lower cost.

Performance and Robustness: Academically speaking, hybrid sub-threshold SRAM is not pure sub-threshold SRAM. At idle conditions, the whole SRAM is under sub-threshold voltage. At operational conditions, 262136 memory cells stay in a sub-threshold idle state while 8 selected memory cells operate at nominal-voltage read/write operation. In effect, by allowing only 0.03% of memory cells (plus ~0.2% of peripheral circuits) to operate at nominal-voltage conditions, all the problems of sub-threshold circuits can be bypassed, while the same robustness of conventional nominal-voltage circuits can be achieved. Performance would be expected to be better than nominal-voltage SRAM due to smaller loadings.

While specific embodiments of the invention have been illustrated and described herein, it is realized that other modifications and changes will occur to those skilled in the art. The scope of the present invention should not be limited by the above specific examples. A Static Random Access Memory (SRAM) device of the present invention divides its memory cells into small sub-groups such as mini-arrays. Each sub-group contains a small fraction (less than 5%) of the memory cells in the SRAM device. The memory cell power supply of the memory cells in each sub-group are connected to a memory cell power supply line. The memory cell power supply lines of different sub-groups are separated so that the voltage on each memory cell power supply line can be controlled independently. The voltages of memory cell power supply lines are controlled by memory cell voltage control circuits. One example of the memory cell voltage control circuits is the row select circuit (Rsel) discussed in previous examples. A memory cell voltage control circuit sets the voltage of a memory cell power supply line at sub-threshold levels when the memory cells connected to the memory cell power supply line are not being accessed, and switches the voltage on the memory cell power supply line to nominal-voltage when part of or all of the memory cells connected to the memory cell power supply line are being accessed. "Access" a memory cell means "read from or write into" the memory cell.

While specific embodiments of the invention have been illustrated and described herein, it is realized that other modifications and changes will occur to those skilled in the art. The "hybrid sub-threshold" approach holds data at sub-threshold voltage while selectively bringing small fractions of circuits back to nominal voltage at operation conditions. This approach is most effective when integrated circuits are divided into small circuit modules. This hybrid sub-threshold approach provides practical solutions for all the problems of sub-threshold circuits. It allows us to utilize knowledge accumulated by the IC industry in the past 50 years instead of re-inventing everything. Hybrid sub-threshold design provides the same cost/robustness as, and better performance than, nominal-voltage circuits, while consuming significantly less power than pure sub-threshold circuits. We believe this "hybrid sub-threshold circuit" approach is the right approach, not only for SRAM, but also for other types of circuits.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What is claimed is:

1. A Static Random Access Memory (SRAM) device comprising:
   A plurality of memory cells each comprises transistors with a channel length shorter than 150 nanometers (nm);
   Memory cell power supply lines, wherein a memory cell power supply line is a electrical connection that connects the memory cell power supply of less than 5 percent of the memory cells in the SRAM device;
   Memory cell voltage control circuits, wherein a memory cell voltage control circuit is a circuit that sets the voltage of a memory cell power supply line at sub-threshold levels when the memory cells connected to the memory cell power supply line are not being accessed, and switches the voltage on the memory cell power supply line to nominal-voltage when part of or all of the memory cells connected to the memory cell power supply line are being accessed.

2. The SRAM device of claim 1 wherein the memory cell power supply line is connected to one row of memory cells.

3. The SRAM device of claim 1 wherein the memory cell power supply line is connected to less than 20 memory cells.

4. The SRAM device of claim 1 wherein each of the memory cells comprises 6 or less than 6 transistors.

5. A method to design or to manufacture a Static Random Access Memory (SRAM) device comprising the steps of:
   Providing a plurality of memory cells by fabricating each of said memory cells with transistor with channel lengths shorter than 150 nanometers (nm);
   Providing memory cell power supply lines, wherein a memory cell power supplies line is an electrical connection that connects the memory cell power supply of less than 5 percent of the memory cells in the SRAM device;
   Providing memory cell voltage control circuits, wherein a memory cell voltage control circuit is a circuit that sets the voltage of a memory cell power supply line at sub-threshold levels when the memory cells connected to the memory cell power supply line are not being accessed, and switches the voltage on the memory cell power supply line to nominal-voltage when part of or all of the memory cells connected to the memory cell power supply line are being accessed.

6. The method in claim 5 comprises the step of providing SRAM memory cell using transistors with channel lengths shorter than 150 nanometers (nm).

7. The method in claim 5 wherein the step of providing the power supply line further comprises a step of connecting the memory cell power supply line to one row of memory cells.

8. The method in claim 5 wherein the step of providing the power supply line further comprises a step of connecting the memory cell power supply line to less than 20 memory cells.

9. The method in claim 5 wherein the step of providing a plurality of memory cells further comprises a step of manufacturing each of the memory cells with 6 or less than 6 transistors.

\* \* \* \* \*